United States Patent
Maigler et al.

(10) Patent No.: US 10,050,622 B2
(45) Date of Patent: Aug. 14, 2018

(54) OPERATING DEVICE AND APPLIANCE HAVING THE DEVICE

(71) Applicant: DIEHL AKO STIFTUNG & CO. KG, Wangen (DE)

(72) Inventors: Andreas Maigler, Bad Waldsee (DE); Bruno Fuhge, Achberg (DE); Joachim Lyszus, Baindt (DE); Ralph Stohr, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 110 days.

(21) Appl. No.: 15/183,926

(22) Filed: Jun. 16, 2016

(65) Prior Publication Data
US 2016/0294387 A1    Oct. 6, 2016

Related U.S. Application Data (63) Continuation of application No. PCT/EP2014/003302, filed on Dec. 10, 2014.

(30) Foreign Application Priority Data

Dec. 18, 2013   (DE) .................. 10 2013 021 093

(51) Int. Cl.
*H03K 17/96* (2006.01)
*H03K 17/968* (2006.01)
(Continued)

(52) U.S. Cl.
CPC ......... *H03K 17/968* (2013.01); *H03K 17/965* (2013.01); *H03K 17/9622* (2013.01);
(Continued)

(58) Field of Classification Search
CPC ............ H03K 17/968; H03K 17/9622; H03K 17/965; H03K 17/97; H03K 17/975; H03K 17/98
(Continued)

(56) References Cited

U.S. PATENT DOCUMENTS

| | | | |
|---|---|---|---|
| 7,667,947 B2 | 2/2010 | Schilling et al. | |
| 2006/0243462 A1* | 11/2006 | Schilling | H03K 17/975 172/10 |
| 2012/0131504 A1* | 5/2012 | Fadell | F24F 11/0086 715/810 |

FOREIGN PATENT DOCUMENTS

| | | | | |
|---|---|---|---|---|
| DE | 102004013947 B3 | 12/2005 | | |
| EP | 2193953 A2 * | 6/2010 | ............ | B60K 35/00 |

(Continued)

*Primary Examiner* — Thomas Skibinski
(74) *Attorney, Agent, or Firm* — Laurence A. Greenberg; Werner H. Stemer; Ralph E. Locher (57) ABSTRACT

An operating device for an electronic household appliance contains a rotary control knob being mounted on a control panel such that a carrier of the rotary control knob can rotate about an axis of rotation relative to the control panel, an angle of rotation detection device for detecting an angle position of the carrier, and a control device that is connected to the angle of rotation detection device and evaluates a measurement signal generated by the angle of rotation detection device. The rotary control knob further contains an operating element that is attached in a non-rotatable manner to the carrier and embodied in an elastically deformable manner and the rotary control knob contains a sensor that is attached in a non-rotatable manner to the carrier and detects any deformation of the operating element. The control device is connected to the sensor and evaluates a measurement signal generated by the sensor.

8 Claims, 4 Drawing Sheets

(51) Int. Cl.
  *H03K 17/965*  (2006.01)
  *H03K 17/98*   (2006.01)
  *H03K 17/97*   (2006.01)
  *H03K 17/975*  (2006.01)

(52) U.S. Cl.
  CPC .......... *H03K 17/97* (2013.01); *H03K 17/975* (2013.01); *H03K 17/98* (2013.01); *H03K 2017/9706* (2013.01); *H03K 2217/94057* (2013.01); *H03K 2217/96054* (2013.01)

(58) Field of Classification Search
  USPC .......... 327/517; 361/290, 287, 277; 715/810
  See application file for complete search history.

(56) References Cited

FOREIGN PATENT DOCUMENTS

| | | |
|---|---|---|
| WO | 2005067146 A1 | 7/2005 |
| WO | 2015090537 A1 | 6/2015 |

\* cited by examiner

OPERATING DEVICE AND APPLIANCE HAVING THE DEVICE

CROSS-REFERENCE TO RELATED APPLICATION

This is a continuation application, under 35 U.S.C. § 120, of copending international application No. PCT/EP2014/003302, filed Dec. 10, 2014, which designated the United States; this application also claims the priority, under 35 U.S.C. § 119, of German patent application No. DE 10 2013 021 093.3, filed Dec. 18, 2013; the prior applications are herewith incorporated by reference in their entirety.

BACKGROUND OF THE INVENTION

Field of the Invention

The present invention relates to an operating device, in particular an operating device for an electronic household appliance and in particular an operating device having a rotary control knob.

In many electronic household appliances, such as cookers, hobs, microwave ovens, dishwashers, washing machines, laundry dryers and the like, actuating elements in the form of rotary knobs or rotary toggles are frequently used, which enable the user to perform specific settings on the appliances. In the case of conventional household appliances, a correspondingly greater number of actuating elements are generally provided in order to be able to set multiple different parameters.

An actuating element in the form of a rotary toggle that is suitable for a touch-control control panel is described by way of example in German patent DE 10 2004 013 947 B3. The rotary position of the rotary toggle or the change in the rotary position of the rotary toggle is detected by a measurement strip on its lower face facing the control panel. This known rotary toggle can also comprise a display device for displaying the current rotary position of the rotary toggle.

SUMMARY OF THE INVENTION

The object of the invention is to provide an improved operating device that comprises a rotary control knob and has a greater number of operating or input options.

The operating device contains a rotary control knob that can be mounted on a control panel in such a manner that a carrier of the rotary control knob can be rotated about an axis of rotation relative to the control panel, an angle of rotation detection device for detecting an angle position of the carrier of the rotary control knob, and a control device that is connected to the angle of rotation detection device and is embodied so as to evaluate a measurement signal that is generated by the angle of rotation detection device. The rotary control knob contains moreover an operating element that is attached in a non-rotatable manner to the carrier and is embodied at least in part in an elastically deformable manner, and also a sensor arrangement that is attached in a non-rotatable manner to the carrier and is embodied so as to detect any deformation of the operating element. The control device is connected to this sensor arrangement of the rotary control knob and is embodied so as to evaluate a measurement signal that is generated by the sensor arrangement.

The operating device in accordance with the invention combines the operating options of a rotary control knob with those of an input or push button in a single operating device. The operating device of the invention is to be used by the user intuitively for performing different operating options. Multiple operating and/or input procedures can be performed using only one rotary control knob.

The rotary control knob of the operating device can be mounted on a control panel in such a manner that a carrier of the rotary control knob can rotate about an axis of rotation relative to the control panel. It is preferred that the axis of rotation of this carrier of the rotary control knob extends essentially in a perpendicular manner with respect to the control panel or its outer face that is facing the user. In one embodiment variant, the carrier is mounted in such a manner that it can rotate on a base of the rotary control knob and the base can be fastened for its part in a non-rotatable manner to a control panel. In another embodiment variant, the carrier can be mounted in such a manner that it can rotate on a control panel. It is preferred that the carrier of the rotary control knob can rotate without limitation about the axis of rotation (so that multiple rotations are possible) or that it can rotate about a limited angle of rotation of preferably approximately 360°, approximately 320°, approximately 270°, approximately 180° or less about the axis of rotation. The term 'carrier' is intended in this connection to describe any structural element that is suitable for supporting the sensor arrangement and the additional operating element. It is preferred that the carrier is manufactured from an electrically non-conductive material, preferably from a synthetic material. It is preferred that the carrier is essentially solid or is embodied at least in part as a hollow body.

The angle of rotation detection device is embodied so as to detect an angle position of the carrier of the rotary control knob. The angle of rotation detection device is preferably embodied in such a manner that it can detect an absolute angle position (and its changes) of the rotary control knob relative to the control panel. It is preferred that the measuring principle of the angle of rotation detection device is the mechanical or capacitive principle, however, other measuring principles such as optical, inductive, piezoelectrical, electrical and combinations of different measuring principles can also be used.

The additional operating element of the rotary control knob is attached in a non-rotatable manner to the carrier, in other words it rotates simultaneously as the carrier rotates. The angle position of the operating element relative to the control panel thus corresponds to the angle position of the carrier or maintains a fixedly predetermined relationship with the angle position of the carrier. Using the angle of rotation detection device, it is consequently possible in addition to determining the (preferably absolute) angle position of the carrier to automatically also determine the (preferably absolute) angle position of the additional operating element.

The operating element of the rotary control knob extends completely or only in part or only in sections around the axis of rotation of the carrier. The operating element is moreover embodied at least in part in an elastically deformable manner. It is preferred that the operating element is embodied in an elastically deformable manner in its entire region of extension around the axis of rotation of the carrier or only in sections. It is preferred that the operating element is elastically deformable in a direction that is essentially coaxial with respect to the axis of rotation of the carrier. It is preferred that any deformation of the operating element can be achieved by exerting pressure in particular by one or multiple fingers of a user, wherein the deformed operating element returns to its original shape in an elastic manner once the pressure is removed. It is preferred that the elastic design of the operating element can be achieved by virtue of selecting a corresponding material (for example, stainless steel, thermoplastics, etc.), by correspondingly dimensioning the operating element (for example in a range of tenths of a millimeter) and/or by correspondingly positioning the operating element.

The sensor arrangement that is likewise attached in a non-rotatable manner to the carrier is embodied so as to detect any deformation of the operating element. It is preferred that the sensor arrangement contains one or multiple sensors. The sensor arrangement is provided corresponding to the extension of the operating element entirely or only in part or only in sections around the axis of rotation of the carrier. It is preferred that the sensor arrangement or its sensors detect a distance or change in distance that the operating element is from the carrier. It is preferred that the measuring principle of the sensor arrangement is the capacitive principle, however other measuring principles, such as optical, capacitive, inductive, piezoelectrical, electrical, mechanical and combinations of different measuring principles, can also be used.

It is preferred that the sensor arrangement is embodied so as to detect a relative angle position of any deformation of the operating element. The accuracy of this angle position detection depends in particular upon the number and the arrangement of the sensors used in the sensor arrangement. It is possible in combination with detecting the absolute angle position of the rotary control knob by means of the angle of rotation detection device to also determine an absolute angle position of any deformation of the operating element.

The control device is connected to the angle of rotation detection device and to the sensor arrangement of the rotary control knob in each case by lines (for example signal lines) or in a wireless manner (for example via radio, an optical coupling, in an inductive manner). It is preferred that the control device contains a microcontroller so as to evaluate the measurement signals that are generated by the angle of rotation detection device and the sensor arrangement. It is preferred that the control device is connected to a main controller, for example of the electronic household appliance, or is integrated into such a main controller.

In a preferred embodiment of the invention, the control device is embodied so as in the case of the operating element of the rotary control knob being operated the control device performs a procedure that is selected from a group of procedures that includes input confirmation, selecting a menu item from a control menu and the like. It is thus possible in a preferred embodiment variant for example by pressing the operating element (for example at a predetermined position) on the rotary control knob to select from a control menu a menu item (for example washing temperature, spin rotational speed, etc.), subsequently to select or set a corresponding parameter value by rotating the rotary control knob and finally by again pressing the operating element to input or confirm the selected or set parameter value. It is preferred that the user does not need to release the rotary control knob during these operating procedures but rather that the user can perform said procedures intuitively and in a single movement sequence.

In a preferred embodiment of the invention, the operating element of the rotary control knob is embodied in an essentially annular manner around the axis of rotation of the carrier and the sensor arrangement contains sensors that are arranged essentially in an annular manner around the axis of rotation of the carrier. This embodiment renders possible preferably a compact construction of the operating device.

In a preferred embodiment of the invention, the sensor arrangement of the rotary control knob is embodied so as to detect any deformation of the operating element at a region or at two regions of the operating element. In the case of this embodiment, it is preferred that a pressure exerted on the operating element by (any) one finger of a user or by a thumb and index finger of a user can be detected and evaluated.

In a further preferred embodiment of the invention, the operating device contains also a display device for displaying at least one piece of information that is selected from a group of pieces of information that includes selectable menu items of a control menu, a selected menu item from a control menu, selectable values of a parameter that can be set, a selected value of a parameter that can be set and the like. The display device renders it possible for the user to operate the operating device in accordance with the invention in a simpler manner, since the user can be provided for example with information regarding the setting options and/or the settings that have been selected.

In a preferred embodiment variant, the display device contains at least one display element which is provided in or on the control panel.

In another preferred embodiment variant, this display device contains at least one display element that is provided in or on the rotary control knob.

In yet another preferred embodiment variant, the display device contains at least one display element that is provided in or on the control panel, and also at least one display element which is provided in or on the rotary control knob.

It is preferred that the above described operating device of the invention can be used in an electronic household appliance, such as for example a cooker, a hob, a microwave oven, a dishwasher, a washing machine, a laundry dryer and the like without the invention being limited to this application.

Other features which are considered as characteristic for the invention are set forth in the appended claims.

Although the invention is illustrated and described herein as embodied in an operating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
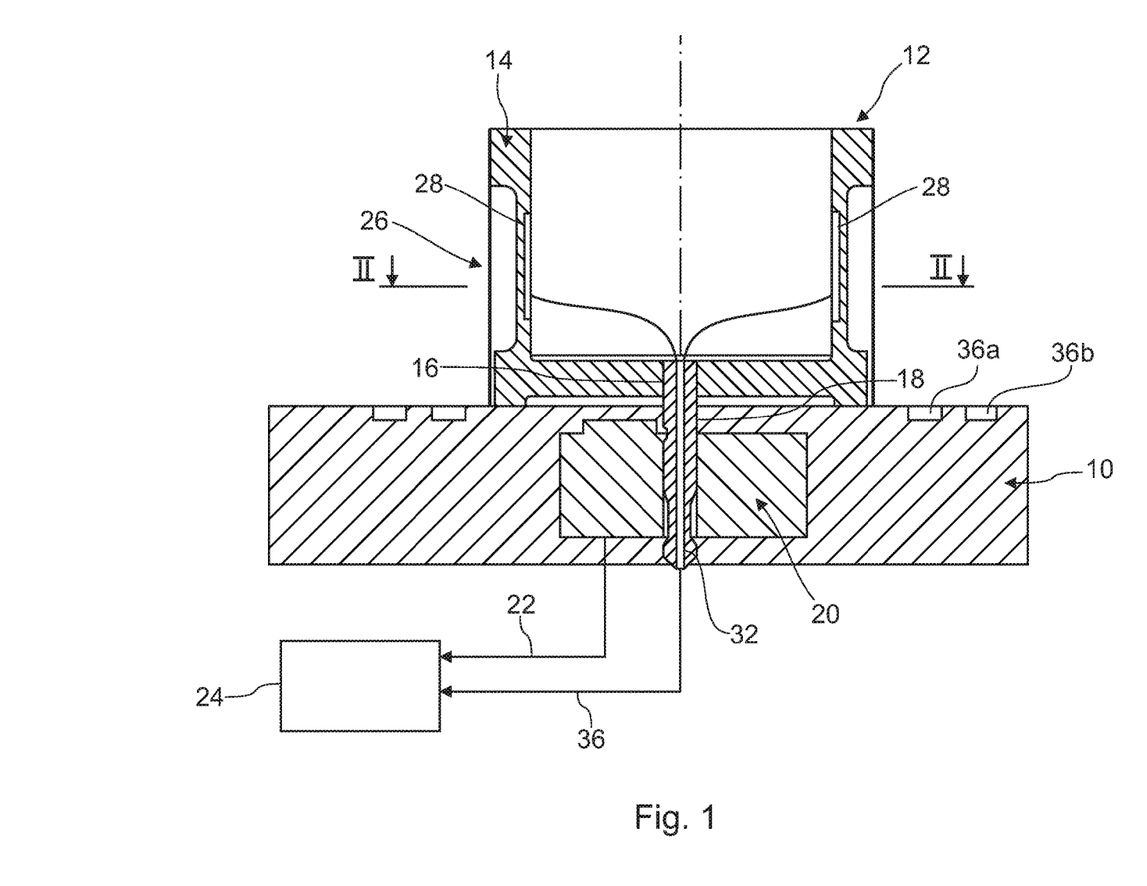
FIG. 1 is a diagrammatic, sectional view of an operating device in accordance with a preferred exemplary embodiment of the invention.
Figure 2A:
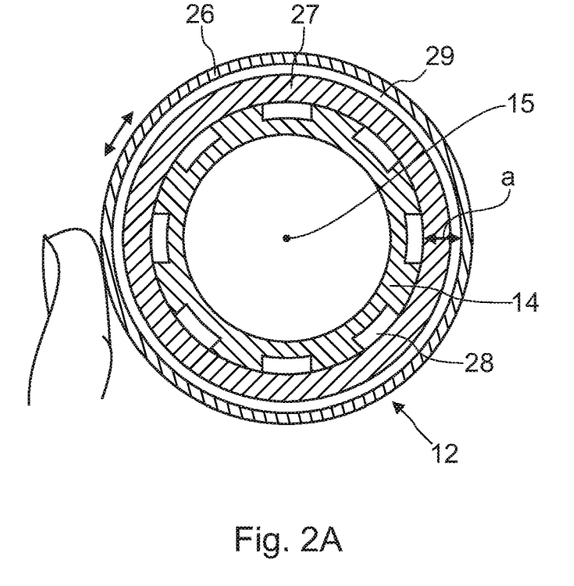
FIG. 2A is a sectional view of the operating device of FIG. 1 in accordance with the section line II-II in FIG. 1 without actuating the operating element.
Figure 2B:
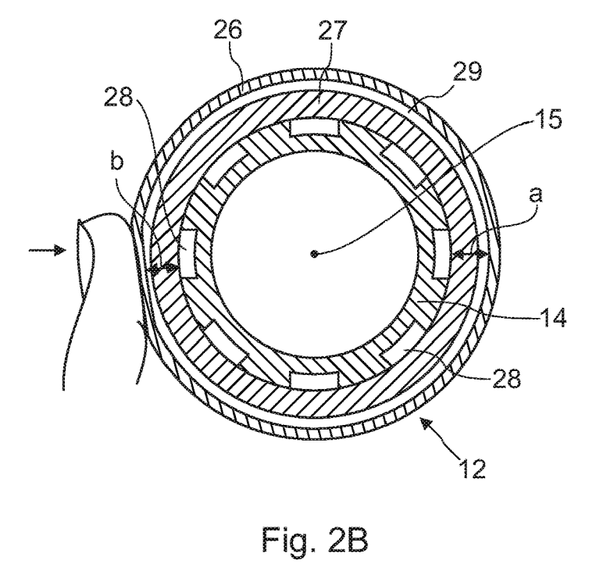
FIG. 2B is a sectional view of the operating device of FIG. 1 in accordance with the section line II-II in FIG. 1 as the operating element is being actuated.

With reference to FIGS. 1 to 2B, initially the construction of an operating device in accordance with a first exemplary embodiment is further explained.

The operating device can be mounted on a control panel 10 that is embodied for example from a synthetic material, metal or glass ceramic and is part of an electronic household appliance such as for example a cooker, a hob, a microwave oven, a dishwasher, a washing machine, a laundry dryer and the like. Depending upon the embodiment of the operating device, it is mounted in a permanent or detachable manner with or without a through-going hole in the control panel 10.

As illustrated in FIG. 1, the operating device contains a rotary control knob (or in short rotary knob) 12. The rotary knob 12 contains a carrier 14 that is embodied from an electrically non-conductive synthetic material and can be rotated about an axis of rotation 15. The axis of rotation 15 extends essentially in a perpendicular manner with respect to the face facing the user (at the top in FIG. 1) of the control panel 10, and the carrier 14 is preferably embodied essentially in a rotational symmetrical manner with respect to this axis of rotation 15, for example essentially in a cylindrical manner. Moreover, the carrier 14 is embodied in part as a hollow body.

On its face (at the bottom in FIG. 1) facing the control panel 10, the carrier 14 is connected to a cam shaft 16 in a force-fitting manner and consequently in a non-rotatable manner. The longitudinal axis of the cam shaft 16 extends essentially in a coaxial manner with respect to the axis of rotation 15 of the carrier 14. The cam shaft 16 is guided through a corresponding through-going hole 18 in the control panel 10 and engages in a rotary selector switch 20 that is mechanical in this exemplary embodiment and is on the face of the control panel 10 that is remote from the user.

The cam shaft 16 and the rotary selector switch 20 form together an angle of rotation detection device of the operating device that is able to detect an absolute angle position of the carrier 14 with respect to the control panel 10. As is illustrated in FIG. 1, the rotary selector switch 20 is connected to a control device 24 by way of a signal line 22 (alternatively for example via radio, an optical coupling, light, in an inductive manner, in a wireless manner, by way of an electromagnetic shaft or a sliding contact). The control device 24 evaluates the measurement signals that are generated by the rotary selector switch 20. The rotary selector switch 20 and the control device 24 can be arranged for example on a common carrier plate or board.

The rotary knob 12 of the operating device contains moreover an essentially annular operating element 26 that is arranged essentially in a concentric manner with respect to the carrier 14 and in this exemplary embodiment extends entirely around the axis of rotation 15 of the rotary knob 12. The operating element 26 is connected to the carrier in a force-fitting manner and consequently in a non-rotatable manner.

The additional operating element 26 of the rotary knob 12 is embodied in an elastically deformable manner. It is manufactured for example from a thin stainless steel metal sheet that has a thickness of by way of example approximately 0.2 mm. Alternatively, it is also possible for example to use thermoplastics for the operating element 26. As is illustrated in FIG. 2B, the operating element 26 is elastically deformable inward in the radial direction as a result of pressure being exerted by for example a finger of a user.

In addition, multiple (in this exemplary embodiment by way of example eight) sensors 28 of a sensor arrangement are arranged on the carrier 14. The sensors 28 are positioned essentially along a circular track in a concentric manner around the axis of rotation 15 of the rotary knob 12.

In the initial position (in other words without pressure being exerted on the operating element 26), the operating element 26 is spaced apart from the sensors 28 by way of an air gap 29 by a distance a. In the case of an operating element 26 being embodied from an electrically conductive material, an essentially annular insulating element 27 is also provided between the sensors 28 and the operating element 26. In the case of a (local) pressure being exerted on the operating element 26, this is elastically deformed (in regions) so that the distance between the operating element 26 and the opposite lying sensor 28 is reduced to a distance b.

This change in the distance from a to b is detected by the sensor 28 that lies opposite the region where pressure is being exerted. In this exemplary embodiment having a metal operating element 26 and an interpositioned insulating element 27, for example capacitive sensors 28 are used that can detect a change in a capacitive value between the sensor 28 and the operating element 26 (as electrodes), the capacitive value being determined by a thickness dimension of the dielectric (formed from the insulating element 27 and the air gap 29). Alternatively, it is also possible to use inductive, optical, mechanical, electrical, piezoelectrical, etc. sensors.

As is indicated in FIG. 1, the sensors 28 of the sensor arrangement are likewise connected to the control device 24 by way of signal lines 30 (alternatively via radio or another wireless coupling). The signal lines 30 are guided from the rotary knob 12 through an axial through-going opening 32 in the cam shaft 16. It is possible using the measurement signals that are generated by the sensors 28 for the control device 24 to determine at which sites the operating element 26 of the rotary knob 12 is being subjected to a pressure loading. In combination with the absolute angle position of the rotary knob that is determined from the measurement signals of the rotary selector switch 20, the control device 24 can also determine an absolute angle position of this pressure loading on the operating element 26. By virtue of a non-wire-connected signal line 30, it is possible to embody the rotary knob 12 in such a manner that it can be detached. The rotary knob 12 can be completely removed or detached from the control panel 10. Moreover, a wireless signal transmission renders it possible for the rotary knob 12 to be rotated by 360° or more about its own axis (continuous rotation).

Figure 3A:
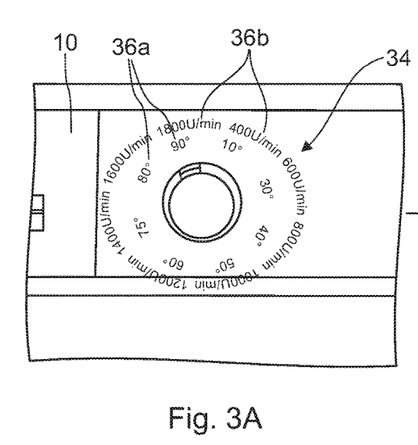
FIGS. 3A-3D are illustrations of different views for explaining a possible operation of the operating device of FIGS. 1 to 2B.

In order to simplify the operation of the operating device in accordance with the invention for the user, it is preferred to provide a display device 34. In this embodiment, the display device 34 contains multiple display elements 36a, 36b that are provided in/on the control panel 10, as is illustrated in FIGS. 1 and 3A. A signal transmission can be performed in a wire-connected manner or in a wireless manner from the rotary knob 12 to the display device 34 or from the display device 34 to the rotary knob 12, by way of example if the rotary knob 12 comprises display elements 38, 40.

The display elements 36a, 36b are provided in each case according to the number of sensors 28 (in other words in this exemplary embodiment in each case eight) and are arranged essentially in a concentric manner around the rotary knob 12 or its axis of rotation 15. In the embodiment variant of FIG. 3, the first display elements 36*a* indicate selectable washing temperatures on their inner circle, whereas the second display elements 36*b* indicate selectable spin rotational speeds on the outer circle. The currently selected or set value of the respective parameter can be optically highlighted for the user for example by means of back lighting. The display elements 36*a*, 36*b* are likewise connected to the control device 24 (although they are not illustrated).

One possible actuation of the described operating device is further explained hereinunder by way of example with reference to FIGS. 3A-3D.

FIG. 3A illustrates initially the starting state of the operating device and its rotary knob 12. The rotary knob 12 is not rotated and the operating element 26 of the rotary knob 12 is not pressed. The rotary selection switch 20 detects in this state the absolute angle position of the rotary knob 12 relative to the control panel 10.

Figure 3B:
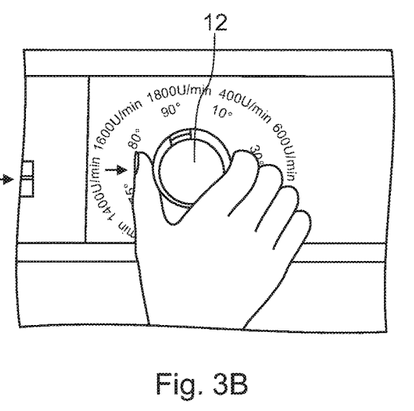

In FIG. 3B, a user presses with his/her thumb and index finger on the left-hand and the right-hand side of the operating element 26 (horizontal actuation). The associated sensors 28 detect this actuation with reference to a change in the distance (a–>b), and the control device 24 can use this to determine the relative angle position of the two pressure loadings. On the basis of knowing the absolute angle position of the rotary knob 12, the control device 24 detects that in this case a horizontal actuation of the operating element 26 has occurred at the rotary knob 12.

With this horizontal actuation of the operating element 26 in FIG. 3B, the user selects from the control menu the menu item for setting the washing temperature. In a corresponding manner, the user can select the menu item for setting the spin rotational speed from the control menu by means of vertically actuating the operating element 26.

Figure 3C:
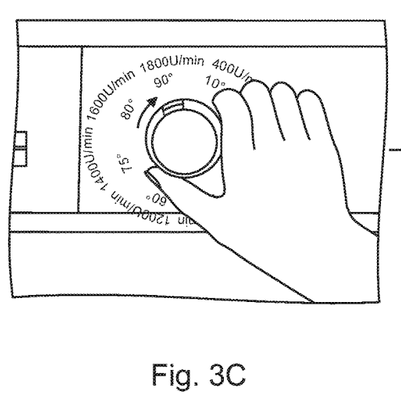

The user rotates the rotary knob in the clockwise direction or in the anti-clockwise direction (see FIG. 3C). The user can reduce the pressure on the operating element 26 so that the operating element is no longer elastically deformed. On the other hand, the user can leave his/her thumb and index finger directly on the operating element 26, since this is attached to the carrier 14 of the rotary knob 12 in a non-rotational manner, so as to rotate the rotary knob 12.

During a rotation of the rotary knob 12, in each case one of the first display elements 36*a* of the display device 34 illuminates continuously so that the user is informed as to which washing temperature he/she has selected with the currently performed rotation of the rotary knob 12. With the aid of the rotary selector switch 20, the control device 24 ascertains the rotary movement of the rotary knob and the correspondingly selected washing temperature.

Figure 3D:
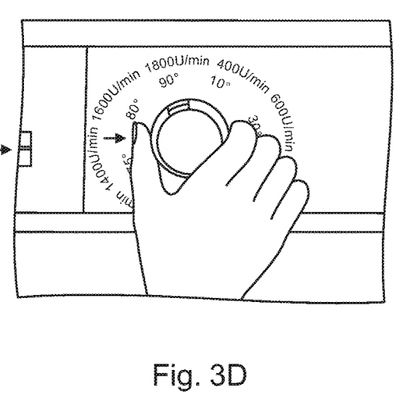

If the user has arrived at the desired washing temperature (he/she recognizes this by the fact that the corresponding element of the first display elements 36*a* illuminates), then he/she stops rotating the rotary knob 12. In order to input the washing temperature that has been selected in this manner, the user confirms this by pressing on the operating element 26 again with his/her thumb and index finger. In the simplest case, this is performed directly at the current rotary position, optionally in the horizontal orientation again.

The user can set a spin rotational speed in the appropriate manner after vertically actuating the operating element 26.

As explained, the user can select a menu item (in this case relating to setting the washing temperature) and the desired parameter value with one hand grip on a single actuating element in the form of a rotary knob 12.

FIGS. 4A to 4D illustrate a further exemplary embodiment of an operating device in accordance with the invention.

In the case of this operating device, the display device 34 is integrated in the rotary knob 12. In this case, in addition to the carrier 14 that can rotate relative to the control panel 10, the rotary knob 12 also contains at least one element that is fixed relative to the control panel 10 and the different display elements 38, 40 of the display device 34 are attached to said element.

In this exemplary embodiment, the display device 34 contains on the end face of the rotary knob 12 that is facing the user a central first display element 38, which—depending upon the actuating state of the rotary knob 12—can by way of example display the selectable menu items or the currently selected parameter value.

Furthermore, the display device 34 contains in this exemplary embodiment multiple (in this case: eight) second display elements 40 that are positioned in the circumferential edge region of the rotary knob 12 on its end face facing the user. The second display elements 40 are embodied in this example as simple illuminating elements (for example light diodes).

In the initial state of the operating device and its rotary knob 12 (see FIG. 4A), neither the rotary knob 12 is rotated nor is the operating element 26 of the rotary knob 12 pressed. The rotary selector switch 20 detects in this state the absolute angle position of the rotary knob 12 relative to the control panel 10. The two currently selectable menu items on the control menu are indicated to the user in different colors on the first display element 38 of the display device 34. Furthermore, the vertical second display elements 40 illuminate in the color of the first menu item and illuminate the horizontal display elements 40 in the color of the second menu item. In this manner, the user is informed as to which menu item of the control menu he/she can select by exerting which pressure on the operating element 26.

Figure 4A:
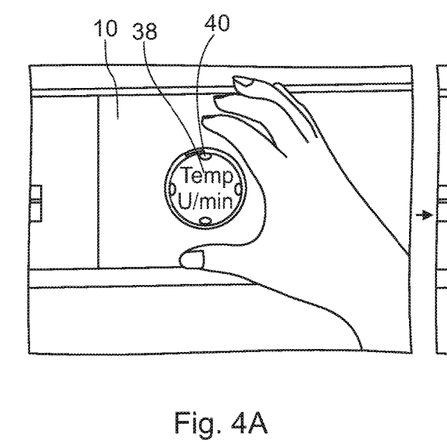
FIGS. 4A-4D are illustrations of different views for explaining a possible operation of an operating device in accordance with a further preferred exemplary embodiment of the invention.
Figure 4B:
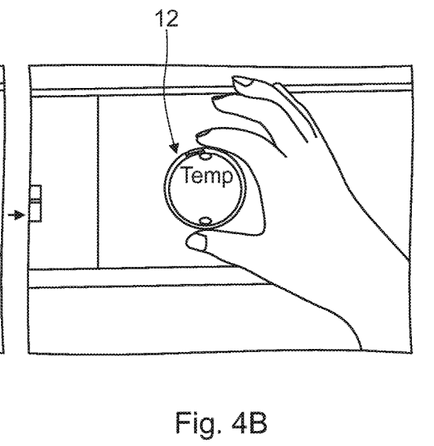

In FIG. 4B, a user presses with his/her thumb and index finger on the upper and the lower face of the operating element 26 (vertical actuation). The associated sensors 28 detect this actuation, and the control device 24 can determine from this the relative angle position of the two pressure loadings. On the basis of knowing the absolute angle position of the rotary knob 12, the control device 24 detects that in this case the operating element 26 has been vertically actuated at the rotary knob 12, by which the menu item relating to setting the washing temperature is to be selected.

Figure 4C:
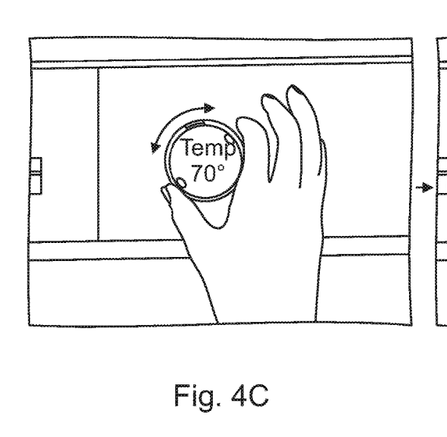
Figure 4D:
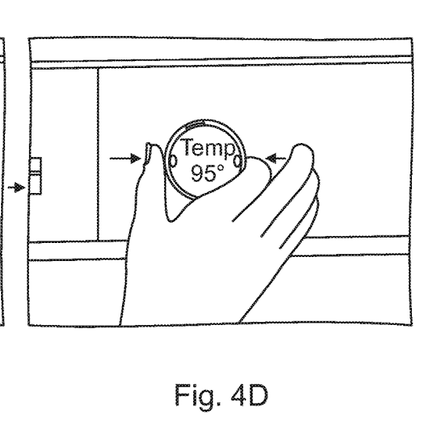

The user rotates the rotary knob 12 in the clockwise direction or in the anti-clockwise direction (see FIG. 4C). The user can reduce the pressure on the operating element 26 so that the operating element is no longer elastically deformed. On the other hand, the user can leave his/her thumb and index finger directly on the operating element 26 since this is attached to the carrier 14 of the rotary knob 12 in a non-rotatable manner.

During a rotation of the rotary knob 12, the first display element 38 of the display device 34 illuminates continuously the currently selected washing temperature, so that the user is informed as to which washing temperature he/she has selected with the currently performed rotation of the rotary knob 12. With the aid of the rotary selector switch 20, the control device 24 ascertains the rotary movement of the rotary knob and the correspondingly selected washing temperature.

If the user has arrived at the desired washing temperature (he/she recognizes this with the aid of the first display element 38), he/she then stops rotating the rotary knob 12.

In order to input the washing temperature that has been selected in this manner, the user confirms this by pressing on the operating element 26 again with his/her thumb and index finger (see FIG. 4D) in the current rotary position of the rotary knob 12.

The user can set a spin rotational speed in the appropriate manner after horizontally actuating the operating element 26.

As explained, the user can also select a menu item (in this case relating to setting the washing temperature) and the desired parameter value with one hand grip on a single actuating element in the form of a rotary knob 12.

Moreover, the structure and operating mode of the operating device that is explained with reference to FIGS. 4A-4D correspond to the operating device that is explained with reference to FIGS. 1 to 3D.

It goes without saying that other numbers of menu items, predetermined parameter values etc. can also be achieved in the two exemplary embodiments. It is preferred that the sensor arrangement comprises a corresponding number of sensors 28.

Furthermore, the additional operating element 26 on the rotary knob 12 in the two exemplary embodiments can alternatively also be actuated using a finger (in lieu of a thumb and an index finger).

The two exemplary embodiment variants of the display device in FIG. 3 and FIG. 4 can also be combined with one another. In this case, one part of the display elements 36a, 36b, 38, 40 can be embodied as electrical elements and another part of the display elements can be embodied for example in the form of an imprint or the like.

The following is a summary list of reference numerals and the corresponding structure used in the above description of the invention:
10 Control panel
12 Rotary control knob, rotary knob
14 Carrier
15 Axis of rotation
16 Cam shaft
18 Through-going hole in 10
20 Rotary selector switch
22 Signal line
24 Control device
26 (Annular) operating element
27 Insulating element
28 Sensor
29 Air gap
30 Signal line
32 Through-going hole in 16
34 Display device
36a, 36b Display elements in 10
38 Display element in 12
40 Display elements in 12

The invention claimed is:

1. An operating device for an electronic household appliance having a control panel, the operating device comprising:
a rotary control knob for mounting on the control panel and having a carrier being rotatable about an axis of rotation relative to the control panel;
an angle of rotation detection device for detecting an angle position of said carrier of said rotary control knob;
a control device connected to said angle of rotation detection device and embodied so as to evaluate a measurement signal that is generated by said angle of rotation detection device;
said rotary control knob having an operating element attached in a non-rotatable manner to said carrier and embodied at least in part in an elastically deformable manner, said rotary control knob further having a sensor configuration attached in a non-rotatable manner to said carrier and is embodied so as to detect any deformation of said operating element; and
said control device is connected to said sensor configuration of said rotary control knob and is embodied so as to evaluate a further measurement signal that is generated by said sensor configuration, wherein said control device embodied so as, in a case of said operating element of said rotary control knob being operated, to perform a procedure that is selected from a group of procedures consisting of confirming an input and selecting a menu item from a control menu.

2. The operating device according to claim 1, wherein said sensor configuration of said rotary control knob is embodied so as to detect a relative angle position of any deformation of said operating element.

3. The operating device according to claim 1, wherein:
said operating element of said rotary control knob is embodied in an annular manner around an axis of rotation of said carrier; and
said sensor configuration has multiple sensors that are disposed in an annular manner around the axis of rotation of said carrier.

4. The operating device according to claim 1, wherein said sensor configuration of said rotary control knob is embodied so as to detect any deformation of said operating element at one region or at two regions of said operating element.

5. The operating device according to claim 1, wherein said operating device contains a display device for displaying at least one piece of information that is selected from a group consisting of pieces of information that includes selectable menu items of a control menu, a selected menu item from a control menu, selectable values of a parameter that can be set and a selected value of a parameter that can be set.

6. The operating device according to claim 5, wherein said display device has at least one display element that is provided in or on the control panel.

7. The operating device according to claim 5, wherein said display device has at least one display element that is provided in or on said rotary control knob.

8. An electronic household appliance, comprising:
an appliance body;
a control panel disposed on said appliance body; and
at least one operating device disposed on said control panel and, containing:
a rotary control knob mounted on said control panel and having a carrier being rotatable about an axis of rotation relative to said control panel;
an angle of rotation detection device for detecting an angle position of said carrier of said rotary control knob;
a control device connected to said angle of rotation detection device and embodied so as to evaluate a measurement signal that is generated by said angle of rotation detection device;
said rotary control knob having an operating element attached in a non-rotatable manner to said carrier and embodied at least in part in an elastically deformable manner, said rotary control knob further having a sensor configuration attached in a non-rotatable manner to said carrier and is embodied so as to detect any deformation of said operating element; and said control device is connected to said sensor configuration of said rotary control knob and is embodied so as to evaluate a further measurement signal that is generated by said sensor configuration,
wherein said control device embodied so as, in a case of said operating element of said rotary control knob being operated, to perform a procedure that is selected from a group of procedures consisting of confirming an input and selecting a menu item from a control menu.

* * * * *